(12) United States Patent
Tsai et al.

(10) Patent No.: US 6,772,805 B2
(45) Date of Patent: Aug. 10, 2004

(54) IN-SITU PURGE SYSTEM FOR ARTICLE CONTAINERS

(75) Inventors: Wen-Shan Tsai, Chang-Hua (TW); Shu-Hua Wang, Taipei (TW); Pi-Hsi Huang, Changhua (TW); Zeng-Zong Twu, Taichung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/303,153

(22) Filed: Nov. 22, 2002

(65) Prior Publication Data

US 2004/0099333 A1 May 27, 2004

(51) Int. Cl.[7] .................................................. B65B 1/04
(52) U.S. Cl. ........................... 141/98; 141/66; 414/217; 156/345
(58) Field of Search ............................... 141/98, 65, 66, 141/192; 414/255, 215, 216, 217; 156/345

(56) References Cited

U.S. PATENT DOCUMENTS

| | | | | |
|---|---|---|---|---|
| 5,217,053 A | * | 6/1993 | Foster et al. .................. | 141/98 |
| 6,267,123 B1 | * | 7/2001 | Yoshikawa et al. ........... | 134/62 |
| 6,315,858 B1 | * | 11/2001 | Shinozuka et al. .... | 156/345.33 |

* cited by examiner

*Primary Examiner*—Steven O. Douglas
(74) *Attorney, Agent, or Firm*—Tung & Associates

(57) ABSTRACT

An in-situ purge system for charging the interior of a semiconductor wafer pod with nitrogen gas after the pod is exposed to ambient moisture, air and particles in a clean room. A gas supply line extends into the pod interior from a gas source, and a gas exhaust line extends from the pod interior to remove moisture, particles and excess gas from the pod interior as the pod contains a wafer-filled cassette and rests typically on a SMIF arm before transfer to a processing tool or other destination in the facility. The removable bottom door of the pod and the bottom plate of the cassette are modified to receive the gas supply line and the gas exhaust line.

20 Claims, 4 Drawing Sheets

IN-SITU PURGE SYSTEM FOR ARTICLE CONTAINERS

FIELD OF THE INVENTION

The present invention relates to systems for purging particles and moisture from containers, and more particularly relates to a system suitable for purging moisture and potential wafer-contaminating particles from wafer cassette containers or pods used to transport semiconductor wafers in a semiconductor production facility.

BACKGROUND OF THE INVENTION

A standardized mechanical interface (SMIF) system is disclosed in U.S. Pat. Nos. 4,532,970 and 4,534,389. Such a SMIF system is designed to reduce particle fluxes onto semiconductor wafers and/or reticles in a semiconductor production facility. The SMIF system prevents or minimizes particle contamination of the wafers during transport and storage of the wafers by ensuring that gaseous media surrounding the wafers is essentially stationary relative to the wafers, and further, by preventing exposure of the wafers to particles from the ambient environment.

The SMIF concept is based on the use of a small volume of motion- and contamination-controlled, particle-free gas to provide a clean environment for semiconductor wafers and other articles. Further details of one such system are described in a paper entitled,"SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111–115.

SMIF systems are designed to prevent contamination by particles which range from below 0.02 µm to above 200 µm. Due to the small geometries of the components in modern semiconductor integrated circuits, particles falling within this size range can significantly adversely affect semiconductor processing. Current geometry sizes for semiconductor integrated circuits have reached less than half a micron, and those circuits are adversely affected by particles having a size as small as 0.01 µm. In the future, semiconductor integrated circuits will be marked by increasingly smaller geometry sizes, requiring protection from contamination by correspondingly smaller particles.

In a typical SMIF system, semiconductor wafers are stored and transported in wafer cassette containers, or pods, and are transferred from the pod to processing equipment typically in the following manner. First, the pod is placed at the interface port of a processing tool. Each pod includes a box and a box door designed to mate with doors on the interface ports of the processing equipment enclosures. Then, latches release the box door, and the box door and the interface port door are opened simultaneously such that particles which may have adhered to the external door surfaces are trapped or sandwiches between the box and interface port doors. A mechanical elevator lowers or translates the two doors, with the cassette riding on top, into the enclosure-covered space. The cassette is transferred by gravity or a manipulator and placed onto the cassette platform of the equipment. After processing, the reverse operation takes place.

Another conventional method for transferring semiconductor wafers from a pod to a processing tool is shown in FIGS. 1–3 of the drawings, which illustrate side views of a SMIF arm cassette loading device 10. The SMIF arm cassette loading device 10 includes a base 11 which is supported on a floor or other supporting surface (not illustrated) in a clean room, and a frame 12 is upward-standing from the base 11. A pod support platform 14 is provided on the frame 12. A SMIF arm 13 is mounted on the frame 12 for bidirectional vertical displacement thereon, and a guide arm 17 for the SMIF arm 13 typically extends upwardly from the frame 12. Accordingly, a wafer pod 18, characterized by a cover 19 which is fitted with a removable bottom pod door 20 and contains a wafer cassette 21 that holds multiple semiconductor wafers 22, is initially placed on the pod support platform 14, as illustrated in FIG. 1. Next, a lifting mechanism (not illustrated) raises the SMIF arm 13 which, in turn, lifts the cover 19 from the removable pod door 20 in the bottom of the cover 19 as the cover 19 is detached from the pod door 20. The pod door 20 remains on the pod support platform 14 and continues to support the cassette bottom plate 23 of the exposed wafer cassette 21 thereon, as illustrated in FIG. 2. A robotic arm 16 then transfers the wafer cassette 21, still holding the semiconductor wafers 22, to an indexer 27, as illustrated in FIG. 3, which indexer 27 indexes the wafers 22 before loading them into the load lock 26 of a processing tool 25. After they are processed in the processing tool 25, the wafers 22 are transferred back from the indexer 27 to the pod support platform 14, as illustrated in FIG. 2. Finally, the SMIF arm 26 is lowered to lower the cover 19 of the wafer pod 18 onto the pod door 20 to again enclose the wafer cassette 21 and wafers 22, as shown in FIG. 1. The pod 18 is then transferred to another processing tool or a stocker either manually or by means of automatically-guided vehicles (AGVs) or overhead transport vehicles (OHTs) that travel on predetermined routes or tracks.

One of the problems associated with the foregoing type of SMIF arm cassette loading device 10 is that ambient air, moisture and some particulate impurities tend to become recaptured in the cover 19 of the pod 18 when the cover 19 is lowered back in place on the pod door 20 on the pod support platform 14. Resulting exposure of the wafers 22 to humidity, atmospheric air and foreign particles in the pod 18 during subsequent transfer to the next processing tool tends to induce corrosion and contamination of the wafers 22, as well as shorten wafer Q-time and adversely affect wafer yield performance.

SUMMARY OF THE INVENTION

Accordingly, an object of the present invention is to provide a system which is capable of purging atmospheric air, moisture and particles from an article-carrying container in a manufacturing or other facility.

Another object of the present invention is to provide an in-situ purge system which is capable of purging contaminants, moisture and ambient air from a wafer cassette container or wafer pod to increase the product wafer Q-time and yield performance of semiconductor wafers.

Still another object of the present invention is to provide an in-situ purge system which is capable of restoring a desired gaseous environment for semiconductor wafers on a water cassette inside a wafer cassette container or pod.

Another object of the present invention is to provide a method for the purging of moisture, ambient air and potential wafer-contaminating particles from a semiconductor wafer pod interior and restoring a normal clean gaseous environment inside the pod to minimize yield contamination and corrosion of semiconductor wafers transferred in a semiconductor production facility.

In accordance with these and other objects and advantages, the present invention comprises an in-situ purge system for charging the interior of a semiconductor wafer pod with nitrogen gas after the pod is exposed to ambient moisture, air and particles in a clean room. A gas supply line extends into the pod interior from a gas source, and a gas exhaust line extends from the pod interior to remove moisture, particles and excess gas from the pod interior as the pod contains a wafer-filled cassette and rests typically on a SMIF arm before transfer to a processing tool or other destination in the facility. The removable bottom door of the pod and the bottom plate of the cassette are modified to receive the gas supply line and the gas exhaust line.

BRIEF DESCRIPTION OF THE DRAWINGS

The present invention will now be described, by way of example, with reference to the accompanying drawings, in which.

DESCRIPTION OF THE PREFERRED EMBODIMENTS

The present invention has particularly beneficial utility in application to purging semiconductor wafer pods of atmospheric moisture and impurities and restoring a desired nitrogen gas composition in the pods. However, it will be recognized and understood that the invention may have utility for purging article-carrying containers in other industrial and product applications.

Figure 11:
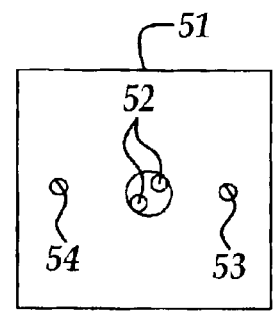
FIG. 11 is a top view of a modified pod support platform in implementation of the present invention.

Referring next to FIGS. 4–7 and 11 of the drawings, a SMIF arm cassette loading device which implements the in-situ purge system of the present invention is generally indicated by reference numeral 30. The SMIF arm cassette loading device 30 according to the present invention includes a gas introduction conduit 31 which extends horizontally from the output port of a gas source 46, particularly a conventional source of pressurized or compressed nitrogen gas or other desired gas known by those skilled in the art, and initially horizontally into the base 11 of the device 30. The gas introduction conduit 31 may be fitted with a gas delivery valve 48 for regulating flow of gas from the gas source 46 through the gas introduction conduit 31. The gas introduction conduit 31 extends upwardly from the base 11 and entirely through the vertical dimension of a modified pod support platform 51, as illustrated in phantom, thus defining a gas introduction opening 53 in the upper surface thereof, as illustrated in FIG. 11. In similar fashion, the upper end of a gas exhaust conduit 32 defines a gas exhaust opening 54 in the upper surface of the modified pod support platform 51, and the gas exhaust conduit 32 extends downwardly through the modified pod support platform 51 and exits the modified pod support platform 51 typically in parallel relationship to the gas introduction conduit 31. The gas exhaust conduit 32 typically extends vertically into the base 11 and exits the base 11 horizontally to connect typically with the intake port of a gas exhaust vent 47 which may be located in the ceiling (not illustrated) or other suitable location in the semiconductor production facility.

Figure 1:
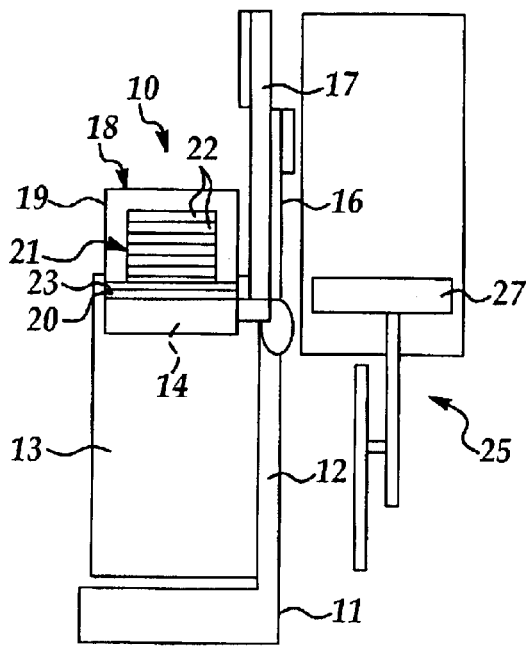
FIG. 1 is a side view of a conventional SMIF arm cassette loading device used in removing a semiconductor wafer cassette from a wafer pod and loading the cassette on an indexer adjacent to a load lock, with the pod shown initially resting on a pod support platform of the device.
Figure 2:
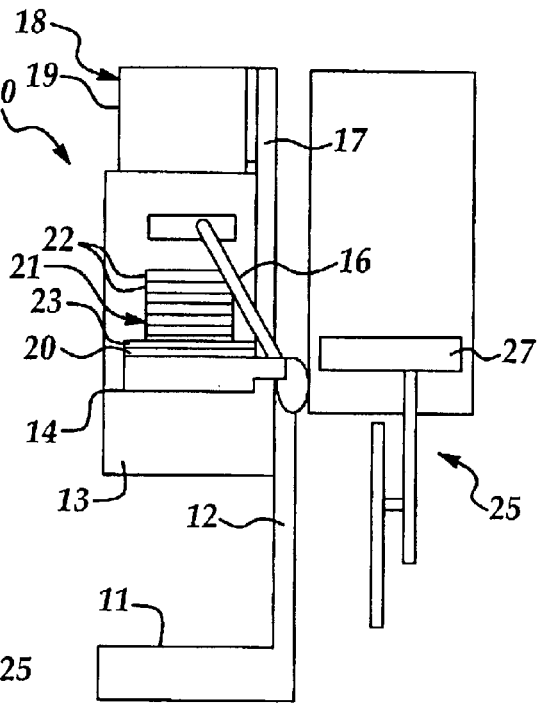
FIG. 2 illustrates removal of the pod cover from the pod bottom of the pod to expose the semiconductor wafer cassette, using the device of claim 1.
Figure 3:
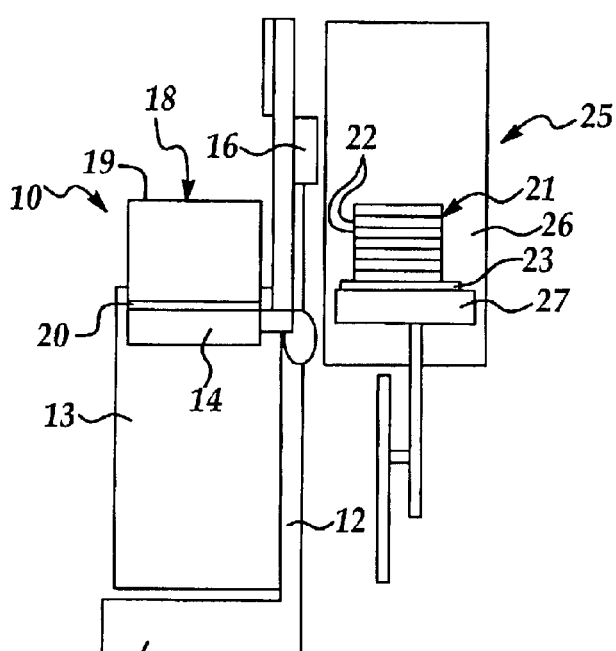
FIG. 3 illustrates the device of FIG. 1 after transferral of the cassette from the device to the indexer.
Figure 4:
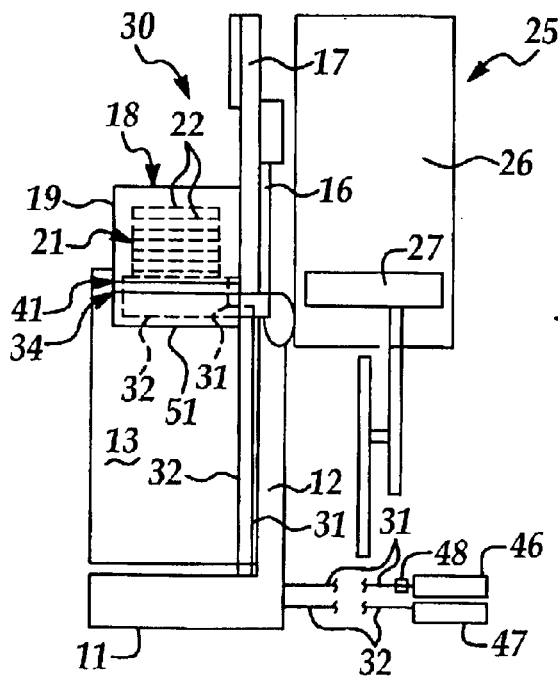
FIG. 4 illustrates a SMIF arm cassette loading device fitted with the in-situ purge system of the present invention.
Figure 5:
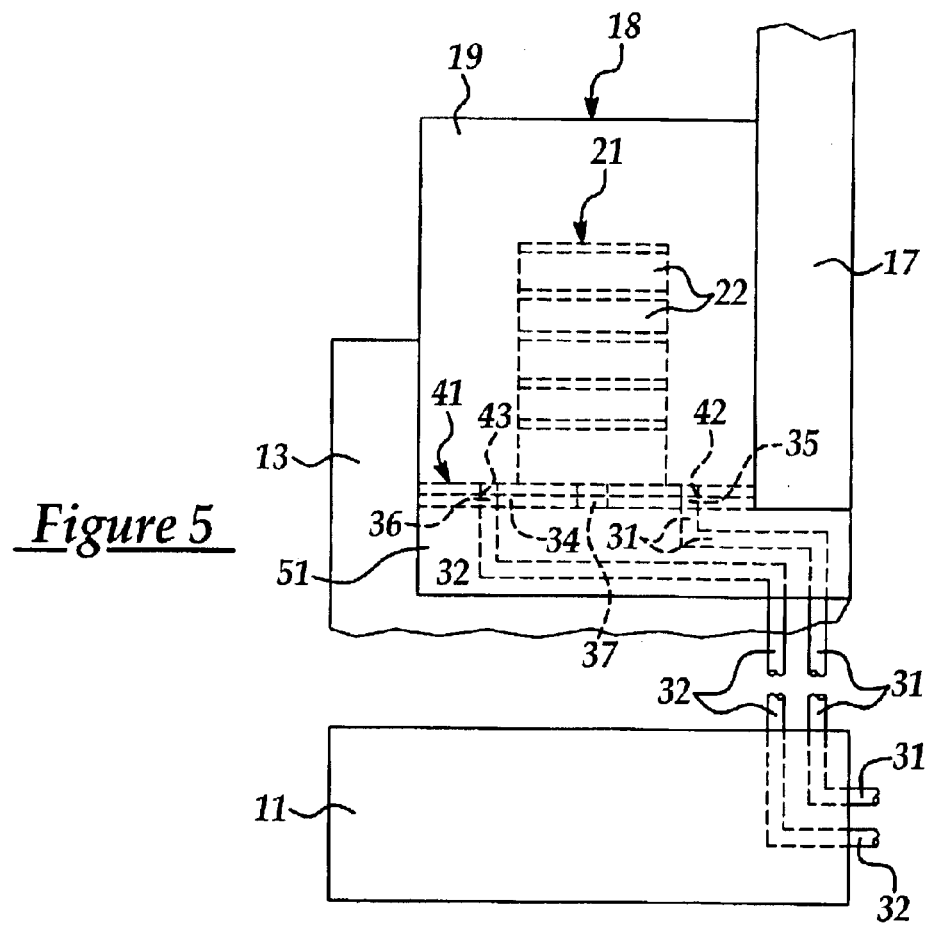
FIG. 5 is a side view, partially in section, of the device illustrated in FIG. 4, more particularly illustrating, in phantom, the interior components of the in-situ purge system.
Figure 6:
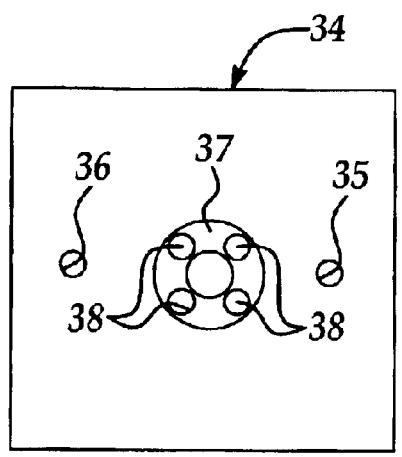
FIG. 6 is a top view of a modified pod door in implementation of the present invention.

As further illustrated in FIG. 5, a semiconductor wafer pod 18 suitable for implementation of the present invention includes a cover 19, the open bottom end of which is closed by a removable modified pod door 34. A typical mechanism for removably mounting the modified pod door 34 on the cover 19 is described in U.S. Pat. No. 4,995,430. As illustrated in FIG. 6, the modified pod door 34 is provided with a gas introduction flow opening 35 which is disposed in alignment with the underlying gas introduction opening 53 (FIG. 11) of the modified pod support platform 51, and thus, the gas introduction conduit 31, when the pod 18 rests on the modified pod support platform 51. The modified pod door 34 is further provided with a gas exhaust flow opening 36, which is disposed in alignment with the underlying gas exhaust opening 54 (FIG. 11) of the modified pod support platform 51, and thus, the gas exhaust conduit 32, when the pod 18 rests on the modified pod support platform 51.

Figure 7:
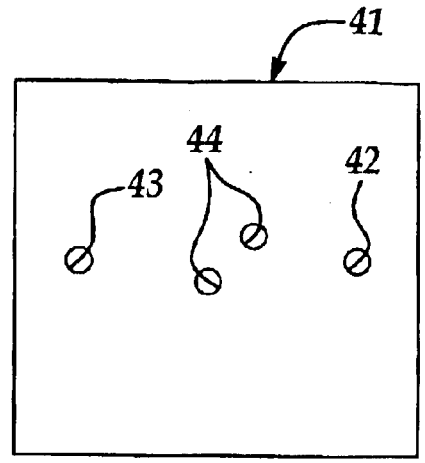
FIG. 7 is a top view of a modified cassette bottom plate in implementation of the present invention.

A wafer cassette 21 normally rests on the modified pod door 34 and holds multiple semiconductor wafers 22 inside the cover 19 of the sealed pod 18. The wafer cassette 21 according to the present invention includes a modified cassette bottom plate 41, as illustrated in FIG. 7, which modified cassette bottom plate 41 is provided with a gas introduction flow opening 42 that registers with the underlying gas introduction flow opening 35 of the modified pod door 34, and is also provided with a gas exhaust flow opening 43 that registers with the underlying gas exhaust flow opening 36 of the modified pod door 34 when the wafer cassette 21 is sealed inside the wafer pod 18. Accordingly, as further illustrated in FIG. 5, the gas introduction flow opening 42 of the modified cassette bottom plate 41 and the underlying gas introduction flow opening 35 of the modified pod door 34 establish gas communication between the interior of the cover 19 and the upper end of the gas introduction conduit 31 at the gas introduction opening 53 (FIG. 11). Likewise, the gas exhaust flow opening 43 of the modified cassette bottom plate 41 and the underlying gas exhaust flow opening 36 of the modified pod door 34 establish gas communication between the interior of the cover 19 and the upper end of the gas exhaust conduit 32 at the gas exhaust opening 54 (FIG. 11).

As further illustrated in FIGS. 6, 7 and 11, the upper surface of the modified pod support platform 51 is typically provided with a pair of upward-standing latch pins 52 which mate with pin openings 38 provided in a pod door latch cam mechanism 37 on the upper surface of the modified pod door 34. The latch pins 52 further extend through respective pin openings 44 in the modified cassette bottom plate 41. In operation, the latch pins 52 rotate the pod door latch cam mechanism 37 between two operating positions that selectively lock or unlock the modified pod door 34 on the cover 19. A more detailed description of the latch mechanism can be found in U.S. Pat. No. 4,995,430.

Figure 10:
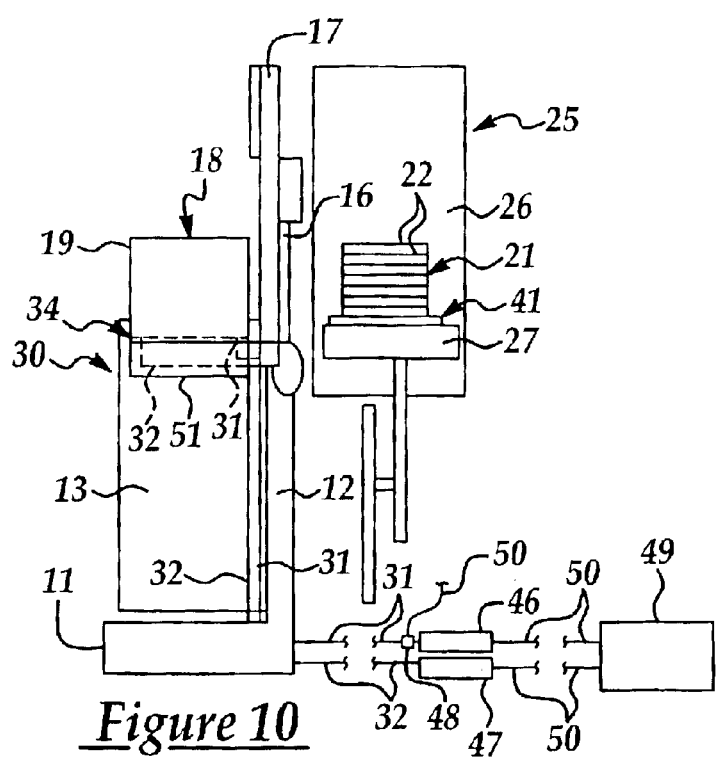
FIG. 10 is a side view of the device in implementation of the present invention, with the cassette resting on the indexer.

Referring next to FIG. 10 of the drawings, it is understood that a process controller 49 which includes a microprocessor and supporting software may be connected to an electric gas delivery valve 48 and/or the control systems of the gas source 46 and the gas exhaust vent 47, respectively, typically by means of wiring 50, to automatically control these elements in operation of the cassette loading device 30 as hereinafter described. Alternatively, those elements may be incorporated into the system to be operated manually without the process controller 49, according to the knowledge of those skilled in the art.

Figure 8:
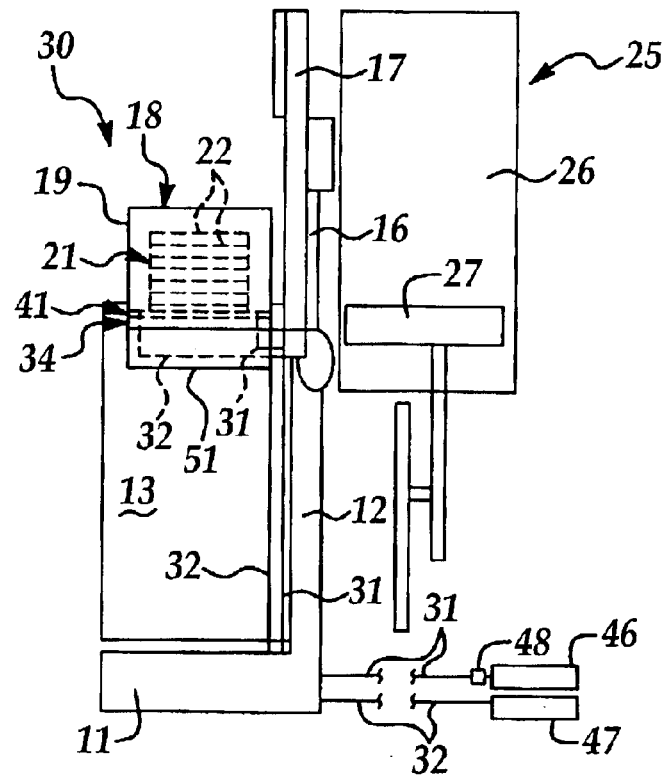
FIG. 8 is a side view of the SMIF arm cassette loading device in implementation of the present invention, with a pod containing a semiconductor wafer cassette (in phantom) shown resting on the pod support platform of the device preparatory to removing the cassette from the pod.
Figure 9:
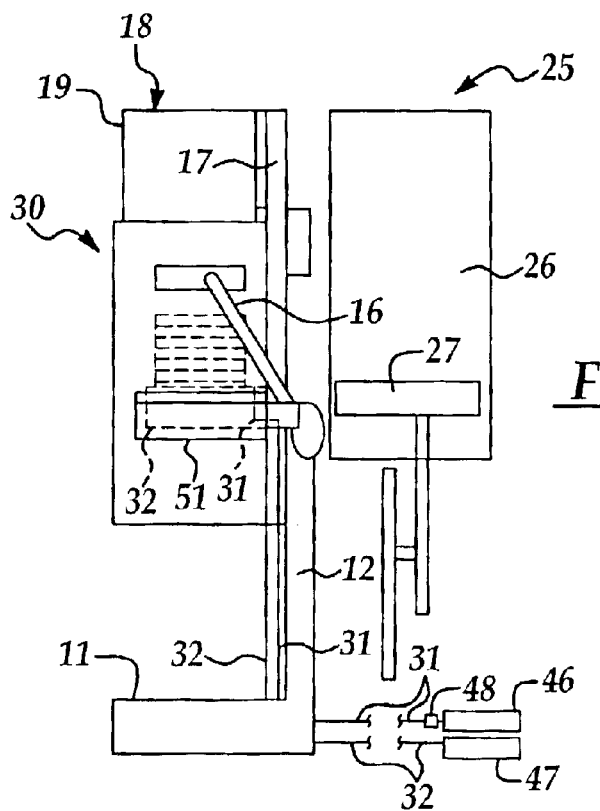
FIG. 9 is a side view of the device in implementation of the present invention, more particularly illustrating loading of the cassette water from the pod support platform to the indexer.

Referring next to FIGS. 5 and 8–10 of the drawings, in typical operation of the cassette loading device 30 according to the present invention, a pod 18, containing a wafer cassette 21 which holds multiple work-in-progress (WIP) semiconductor wafers 22, is transferred typically from a manual transport device, an automatically-guided vehicle (AGV) or an overhead transport vehicle (OHT) to rest on the modified pod support platform 51 of the cassette loading device 30, as illustrated in FIG. 8. As the modified pod door 34 is positioned on the modified pod support platform 51, the gas introduction conduit 31 is aligned with the interior of the pod cover 19 through the openings 42, 35, and the gas exhaust conduit 32 is aligned with the interior of the pod cover 19 through the openings 43, 36, as heretofore described with respect to FIG. 5. The SMIF arm 13 of the cassette loading device 30 is next operated to lift the cover 19 of the pod 18 from the modified pod door 34, as illustrated in FIG. 9, with the modified pod door 34 remaining on the modified pod support platform 51 and the modified cassette bottom plate 41 remaining on the modified pod door 34. The robotic arm 16 of the cassette loading device 30 is next operated to lift the modified cassette bottom plate 41 and the wafer cassette 21 from the modified pod door 34, which remains in place on the modified pod support platform 51, and the robotic arm 16 places the wafer cassette 21 on the indexer 27, as illustrated in FIG. 10. The semiconductor wafers 22 are then loaded into the load lock 26 of the processing tool 25 and subjected to a processing operation. The SMIF arm 13 is typically lowered to temporarily replace the cover 19 on the modified pod door 34, as further illustrated in FIG. 10.

After the processing operation in the processing tool 25 is completed, the wafers 22 are unloaded by conventional means from the load lock 26 and re-loaded on the wafer cassette 21. After the SMIF arm 13 is again raised to lift the cover 19 from the modified pod door 34, the robotic arm 16 is again operated, this time to transfer the wafer cassette 21 carrying the processed wafers 22 from the indexer 27 to the modified pod door 34, as further illustrated in FIG. 9. The SMIF arm 13 is lowered to replace the cover 19 on the modified pod door 34.

As the cover 19 is lowered back in place on the modified pod door 34, a substantial quantity of ambient air from the clean room of the semiconductor production facility is captured in the cover 19. This ambient air typically includes some moisture which tends to corrode the wafers 22, as well as small, potential wafer-contaminating particles. There is therefore a need to remove the moisture and particles from the pod cover 19 interior in order to prolong wafer Q-time and improve wafer yield performance. Accordingly, the in-situ purge system of the present invention is operated to purge the interior of the cover 19 in order to remove the moisture and particles and restore the typically nitrogen gas contents of the cover 19. This is accomplished by operating the gas source 46 and opening the gas delivery valve 48 to facilitate distribution of nitrogen from through the gas introduction conduit into the interior of the pod cover 19. Simultaneously, the gas exhaust vent 47 may be operated to draw particles, moisture and excess nitrogen from the interior of the cover 19, through the gas exhaust conduit 32 and through the vent 47. After typically about 60 seconds of nitrogen delivery from the gas source 47 to the cover 19, the normal nitrogen concentration has been restored to the interior of the pod cover 19. Accordingly, the gas delivery valve 48 is closed and/or operation of the gas source 46 is terminated to prevent further flow of the nitrogen gas into the cover 19. The pod 18 is then removed from the cassette loading device 30 and delivered to a process station, stocker or other desired destination in the facility either manually or by means of an automatic guided vehicle (AGV) or overhead transport vehicle (OHT).

While the preferred embodiments of the invention have been described above, it will be recognized and understood that various modifications may be made in the invention and the appended claims are intended to cover all such modifications which may fall within the spirit and scope of the invention.

What is claimed is:

1. An in-situ system for purging ambient air from a container, said system comprising:
    a container support platform having a plurality of latch pins, a gas introduction opening and a gas exhaust opening;
    a container door for removably engaging the container and said latch pins of said container support platform, said container door having a gas introduction flow opening and a gas exhaust flow opening;
    a gas introduction conduit provided in gas communication with said gas introduction flow opening;
    a gas source provided in gas communication with said gas introduction conduit for introducing a gas into the container through said gas introduction conduit and said gas introduction flow opening; and
    a gas exhaust conduit provided in gas communication with said gas exhaust flow opening for delivering the ambient air and excess quantities of the gas from the container.

2. The system of claim 1 further comprising a gas exhaust vent provided in gas communication with said gas exhaust conduit for venting the gas.

3. The system of claim 1 further comprising a gas delivery valve provided in said gas introduction conduit between said gas source and said gas introduction flow opening for controlling flow of the gas through said gas introduction conduit.

4. The system of claim 3 further comprising a gas exhaust vent provided in gas communication with said gas exhaust conduit for venting the gas.

5. The system of claim 1 further comprising a process controller operably connected to said gas source for automatically operating said gas source.

6. The system of claim 5 further comprising a gas exhaust vent provided in gas communication with said gas exhaust conduit for venting the gas and wherein said process controller is operably connected to said gas exhaust vent for automatically operating said gas exhaust vent.

7. The system of claim 5 further comprising a gas delivery valve provided in said gas introduction conduit between said gas source and said gas introduction flow opening for controlling flow of the gas through said gas introduction conduit, and wherein said process controller is operably connected to said gas delivery valve for automatically opening and closing said gas delivery valve.

8. The system of claim 7 further comprising a gas exhaust vent provided in gas communication with said gas exhaust conduit for venting the gas and wherein said process controller is operably connected to said gas exhaust vent for automatically opening and closing said gas exhaust vent.

9. An in-situ system for purging ambient air from a semiconductor wafer pod having a pod cover adapted for containing a wafer cassette, said system comprising:
   a pod door for removably engaging the pod cover, said pod door having a gas introduction flow opening and a gas exhaust flow opening;
   a cassette bottom plate for removably engaging said pod door, said cassette bottom plate having a plate gas flow opening and a plate exhaust flow opening for substantial alignment with said gas introduction flow opening and said gas exhaust flow opening, respectively, of said pod door;
   a pod support platform for supporting said pod door;
   a pod door latch cam mechanism carried by said pod door for removably connecting said pod door and said cassette bottom plate to said pod support platform;
   a gas introduction conduit provided in gas communication with said gas introduction flow opening;
   a gas source provided in gas communication with said gas introduction conduit for introducing a gas into the pod cover through said gas introduction conduit, said gas introduction flow opening and said plate gas flow opening, respectively; and
   a gas exhaust conduit provided in gas communication with said gas exhaust flow opening for receiving the ambient air and excess quantities of the gas from the pod cover.

10. The system of claim 9 further comprising a gas exhaust vent provided in gas communication with said gas exhaust conduit for venting the gas.

11. The system of claim 9 further comprising a gas delivery valve provided in said gas introduction conduit between said gas source and said gas introduction flow opening for controlling flow of the gas through said gas introduction conduit.

12. The system of claim 11 further comprising a gas exhaust vent provided in gas communication with said gas exhaust conduit for venting the gas.

13. The system of claim 9 further comprising a process controller operably connected to said gas source for automatically operating said gas source.

14. The system of claim 13 further comprising a gas exhaust vent provided in gas communication with said gas exhaust conduit for venting the gas, and wherein said process controller is operably connected to said gas exhaust vent for automatically opening and closing said gas exhaust vent.

15. The system of claim 13 further comprising a gas delivery valve provided in said gas introduction conduit between said gas source and said gas introduction flow opening for controlling flow of the gas through said gas introduction conduit, and wherein said process controller is operably connected to said gas delivery valve for automatically opening and closing said gas delivery valve.

16. The system of claim 15 further comprising a gas exhaust vent provided in gas communication with said gas exhaust conduit for venting the gas, and wherein said process controller is operably connected to said gas exhaust vent for automatically opening and closing said gas exhaust vent.

17. A method of purging ambient air from a semiconductor wafer pod having a pod cover, said method comprising the steps of:
   providing a pod support platform having a gas introduction opening and a gas exhaust opening;
   providing a pod door for removably closing the pod cover and removably engaging said pod support platform;
   providing a cassette bottom plate for removably engaging said pod door;
   providing a latch cam mechanism for removably attaching said pod door and said cassette bottom plate to said pod support platform;
   providing a gas introduction flow opening and a gas exhaust flow opening in said pod door and said cassette bottom plate;
   providing a gas introduction conduit in gas communication with said gas introduction flow opening and a gas exhaust conduit in gas communication with said gas exhaust flow opening;
   providing a gas source in gas communication with said gas introduction conduit;
   delivering a quantity of a gas from said gas source into the pod cover; and
   removing the ambient air and excess volumes of said quantity of gas from the wafer pod through said gas exhaust conduit.

18. The method of claim 17 further comprising the steps of providing a gas exhaust vent in communication with said gas exhaust conduit and venting the ambient air and said excess volumes of said quantity of gas through said gas exhaust conduit.

19. The method of claim 18 further comprising the step of providing a gas delivery valve in said gas introduction conduit between said gas source and said gas introduction flow opening and controlling flow of the gas through said gas introduction conduit by operation of said gas delivery valve.

20. The method of claim 19 further comprising the step of operably connecting a process controller to said gas source, said gas exhaust vent and said gas delivery valve and operating said gas source, said gas exhaust vent and said gas delivery valve using said process controller.

* * * * *